United States Patent
Ito (10) Patent No.: US 10,971,848 B2
(45) Date of Patent: Apr. 6, 2021

(54) CONNECTOR WITH VENTILATION PASSAGE

(71) Applicant: Sumitomo Wiring Systems, Ltd., Mie (JP)

(72) Inventor: Yui Ito, Mie (JP)

(73) Assignee: Sumitomo Wiring Systems, Ltd.

( * ) Notice: Subject to any disclaimer, the term of this patent is extended or adjusted under 35 U.S.C. 154(b) by 0 days.

(21) Appl. No.: 16/562,549

(22) Filed: Sep. 6, 2019

(65) Prior Publication Data
US 2020/0083634 A1 Mar. 12, 2020

(30) Foreign Application Priority Data

Sep. 6, 2018 (JP) ............................. JP2018-166798

(51) Int. Cl.
| H01R 13/46 | (2006.01) |
| H01R 13/6588 | (2011.01) |
| H01R 4/48 | (2006.01) |
| H01R 13/52 | (2006.01) |

(52) U.S. Cl.
CPC ........... *H01R 13/46* (2013.01); *H01R 4/4827* (2013.01); *H01R 13/6588* (2013.01); *H01R 13/5227* (2013.01)

(58) Field of Classification Search
CPC .. H01R 13/46; H01R 4/4827; H01R 13/6588; H01R 13/5227
USPC ........................................ 439/206, 191, 205
See application file for complete search history.

(56) References Cited

U.S. PATENT DOCUMENTS

| 7,618,275 B2* | 11/2009 | Owen, Sr. ............. | F21S 48/337 |
| | | | 439/206 |
| 2003/0216119 A1* | 11/2003 | Mashiko ............ | H01R 13/5227 |
| | | | 454/275 |

FOREIGN PATENT DOCUMENTS

JP 2012-99274 5/2012

OTHER PUBLICATIONS

JP 2012-099274 A machine translation.*

* cited by examiner

*Primary Examiner* — Renee S Luebke
*Assistant Examiner* — Paul D Baillargeon
(74) *Attorney, Agent, or Firm* — Gerald E. Hespos; Michael J. Porco; Matthew T. Hespos (57) ABSTRACT

A connector (1) is mounted on a case (12) including an internal space (120) accommodating an electronic board (11). The connector (1) includes first terminals (3), a first core (4), second terminals (5), a second core (6), a housing (7) and a ventilation passage (8). The ventilation passage (8) allows the internal space (120) of the case (12) to communicate with outside air. At least a part of the ventilation passage (8) is constituted by a groove (40) formed in at least one of mutually overlapping surfaces (411, 611) of the first core (4) and the second core (6). An outer vent (81) of the ventilation passage (8) is formed at a position closer to the case (12) than the receptacle (71) in a Z direction.

11 Claims, 12 Drawing Sheets

CONNECTOR WITH VENTILATION PASSAGE

BACKGROUND

Field of the Invention

The invention relates to a connector.

Related Art

Japanese Unexamined Patent Publication No. 2012-99274 discloses a device connector mounted on a wall of a case that accommodates a circuit board. The device connector is formed with a vent that allows communication between the inside and outside of the case to suppress an increase of a pressure in the case due to heat generated by the circuit board.

The vent in the housing of the device connector can be formed by arranging a pin in a mold for the connector housing and removing the pin after the housing is molded. However, the pin is long and can break while molding the housing. A broken pin may not form the vent properly.

The device connector described in Japanese Unexamined Patent Publication No. 2012-99274 forms the vent by using first and second primary molded bodies for holding terminal fittings. The connector housing is insert-molded with the primary molded bodies as cores. Specifically, a groove is formed in a mating surface of the first primary molded body. The two primary molded bodies then are overlapped so that the second primary molded body covers an opening of the groove and forms the vent inside the groove.

One end of the vent disclosed in the device connector of Japanese Unexamined Patent Publication No. 2012-99274 is open toward a space inside a receptacle of the connector housing into which a mating connector is inserted. Thus, the mating connector that is inserted in the receptacle can cover one end of the vent and can suppress ventilation between the inside and outside of the case unless the mating connector also has a vent.

The invention was developed in view of such a problem and aims to provide a connector that allows pressure in a device case to escape even when connected to a mating connector.

SUMMARY

The invention is directed to a connector to be provided on a case having an internal space for accommodating an electronic board. The connector includes a plurality of first terminals and a plurality of second terminals. A first core holds the first terminals while exposing both ends of the first terminals, and a second core faces and overlaps with the first core. The second core holds the second terminals while exposing both ends of the second terminals. The connector also has a housing with a tubular receptacle surrounding one end part of each of the first and second terminals. The receptacle is configured to have a mating connector inserted therein. The housing at least partially covers the first and second cores. A ventilation passage allows the internal space to communicate with outside air. At least a part of the ventilation passage is constituted by a groove formed in at least one of the overlapping surfaces of the first and second cores, and an outer vent of the ventilation passage is formed at a position closer to the case than the receptacle in a mounting direction of the connector to the mating connector. Thus, the outer vent of the ventilation passage is not closed even with the mating connector mounted to the connector. Therefore, the connector easily allows a pressure in the case to escape even with the mating connector is connected to the connector.

DETAILED DESCRIPTION

A first embodiment of a connector is described using FIGS. 1 to 8.

Figure 4:
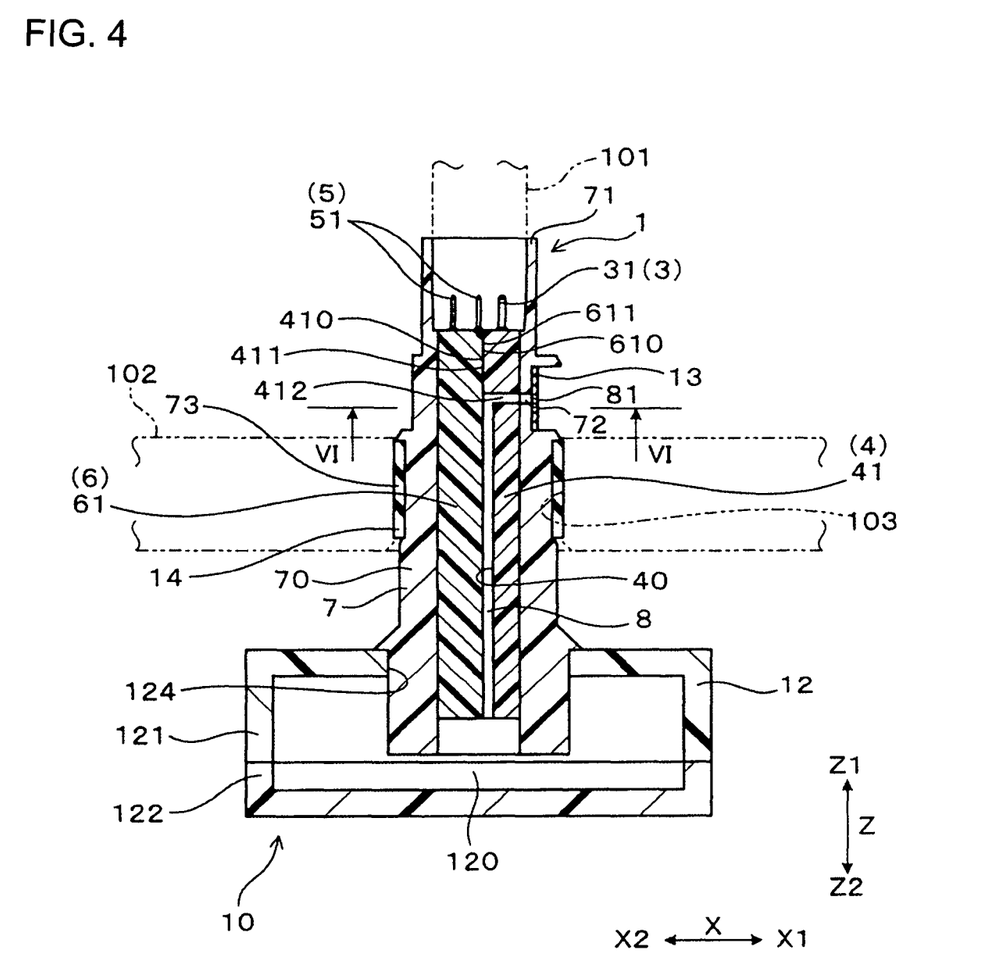
FIG. 4 is a section along IV-IV of FIG. 1.
Figure 5:
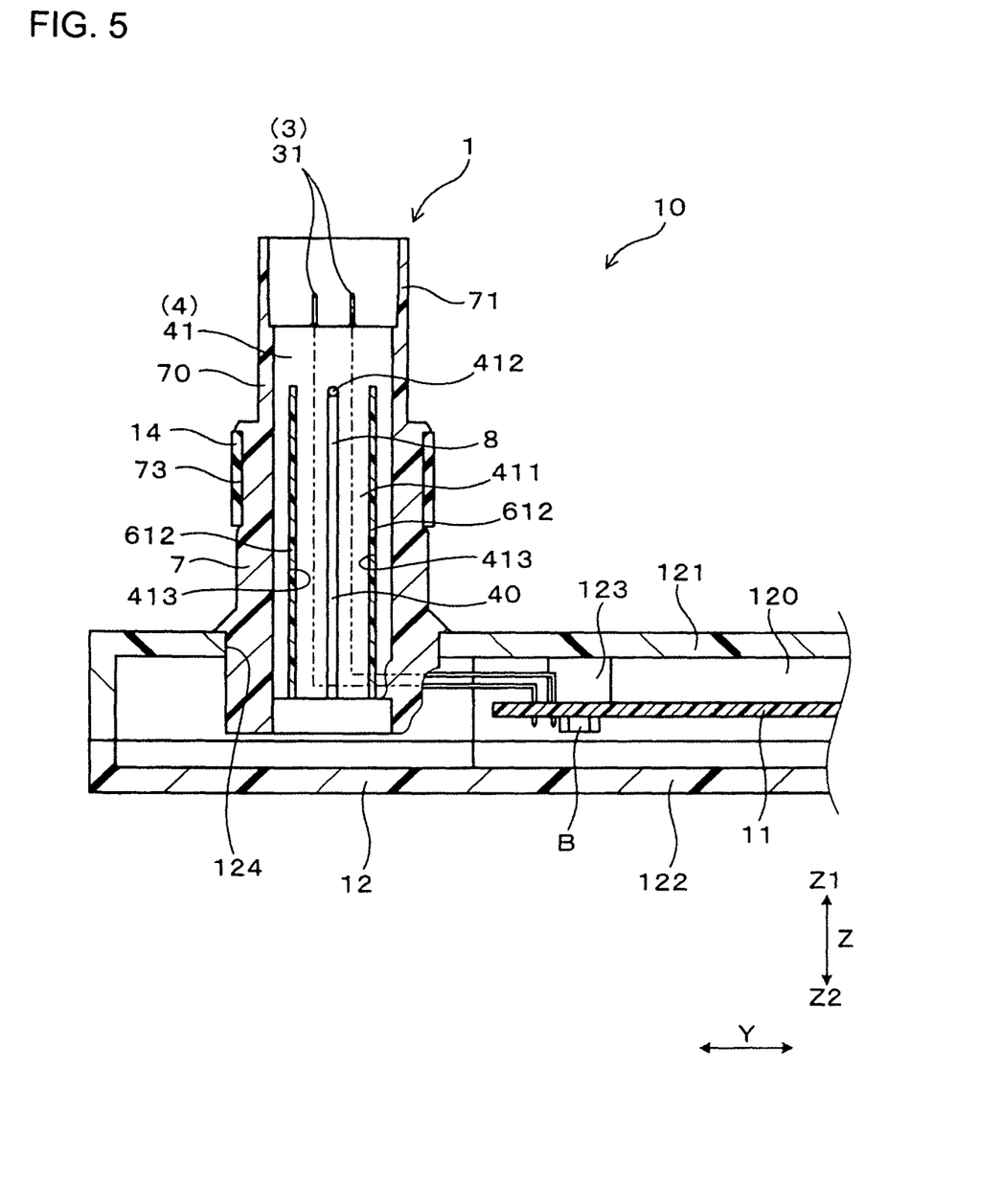
FIG. 5 is a section along V-V of FIG. 1.
Figure 6:
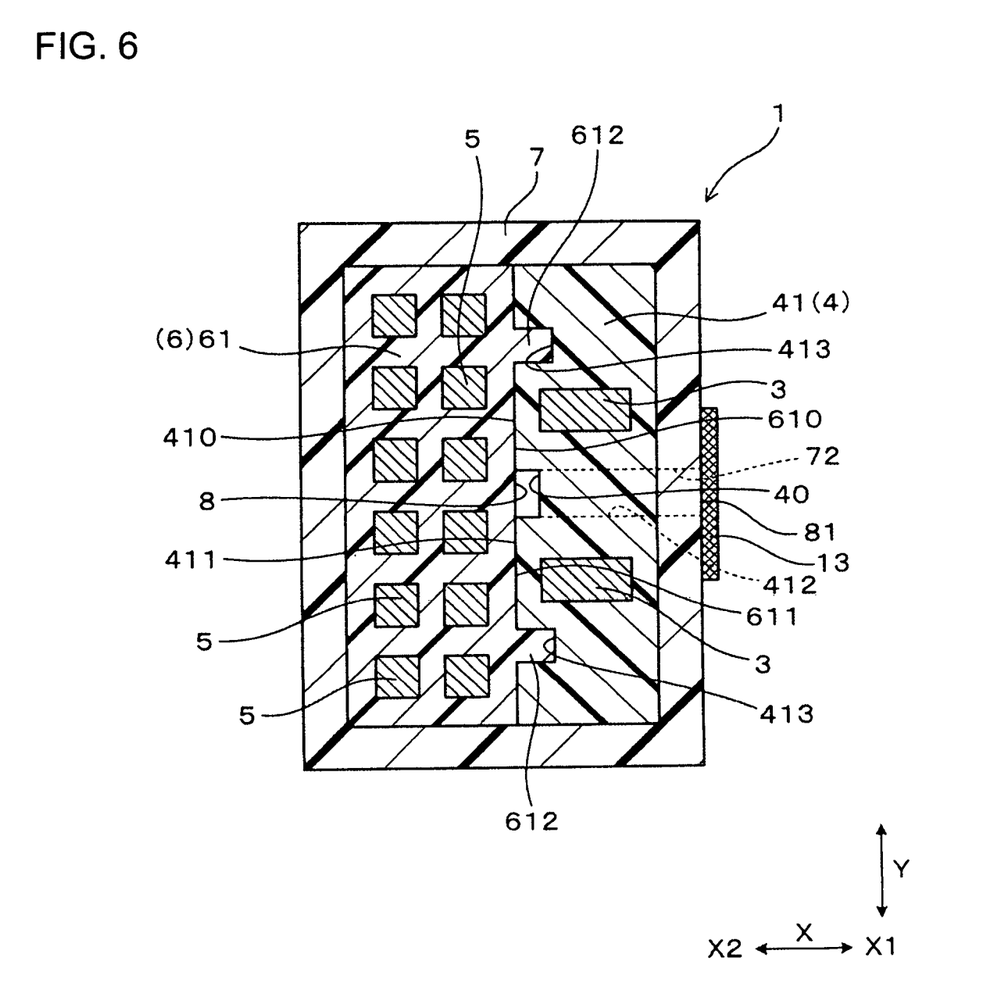
FIG. 6 is a section along VI-VI of FIG. 2.

As shown in FIG. 5, a connector 1 is mounted on a case 12 having an internal space 120 in which an electronic board 11 is accommodated. As shown in FIGS. 4 and 6, the connector 1 includes first terminals 3, a first core 4, second terminals 5, a second core 6, a housing 7 and a ventilation passage 8.

As shown in FIG. 5, the first core 4 holds the first terminals 3 while exposing both ends of the first terminals 3. As shown in FIGS. 4 and 6, the second core 6 faces and overlaps with the first core 4. Further, the second core 6 holds the second terminals 5 while exposing both end parts of the second terminals 5.

As shown in FIGS. 1, 2, 4 and 5, the housing 7 includes a receptacle 71 that surrounds one end part of each of the first terminals 3 and the second terminals 5. The receptacle 71 has a tubular shape so that a mating connector 101 can be inserted therein and connected to the connector 1 of this embodiment. The housing 7 at least partially covers the first core 4 and the second core 6. As shown in FIG. 4, the ventilation passage 8 allows the internal space 120 of the case 12 to communicate with outside air.

As shown in FIGS. 4 and 6, at least a part of the ventilation passage 8 is constituted by a groove 40 formed in at least one of overlapping surfaces 411, 611 of the first core 4 and the second core 6. An outer vent 81 is formed at a position closer to the case 12 than the receptacle 71 in a mounting direction Z of the connector 1 to the mating connector 101. Thus, the outer vent 81 forms an opening of the ventilation passage 8 on the outside air side.

In this embodiment, the mounting direction of the connector 1 to the mating connector 101 is referred to as a Z direction. Further, one side in the Z direction closer to the case 12 than the receptacle 71 is referred to as a Z2 side, and an opposite side thereof is referred to as a Z1 side. Further, one direction perpendicular to the Z direction is referred to as an X direction, and a direction perpendicular to both the X direction and the Z direction is referred to as a Y direction. The X direction is an arrangement direction of a first plate 41 and a second plate 61 to be described later.

As shown in FIG. 5, the connector 1 can be used for a control device 10 that has an electronic board 11 for controlling the operation of an in-vehicle device, such as an automatic transmission. The electronic board 11 is accommodated in the box-shaped case 12 and is configured to generate heat by energization. The case 12 of the control device 10 has an internal space 120 that is a sealed in a state where the ventilation passage 8 of the connector 1 is closed. The connector 1 can be used as a connector for electrically connecting the electronic board 11 accommodated in the case 12 and an electrical device outside the case 12.

Figure 2:
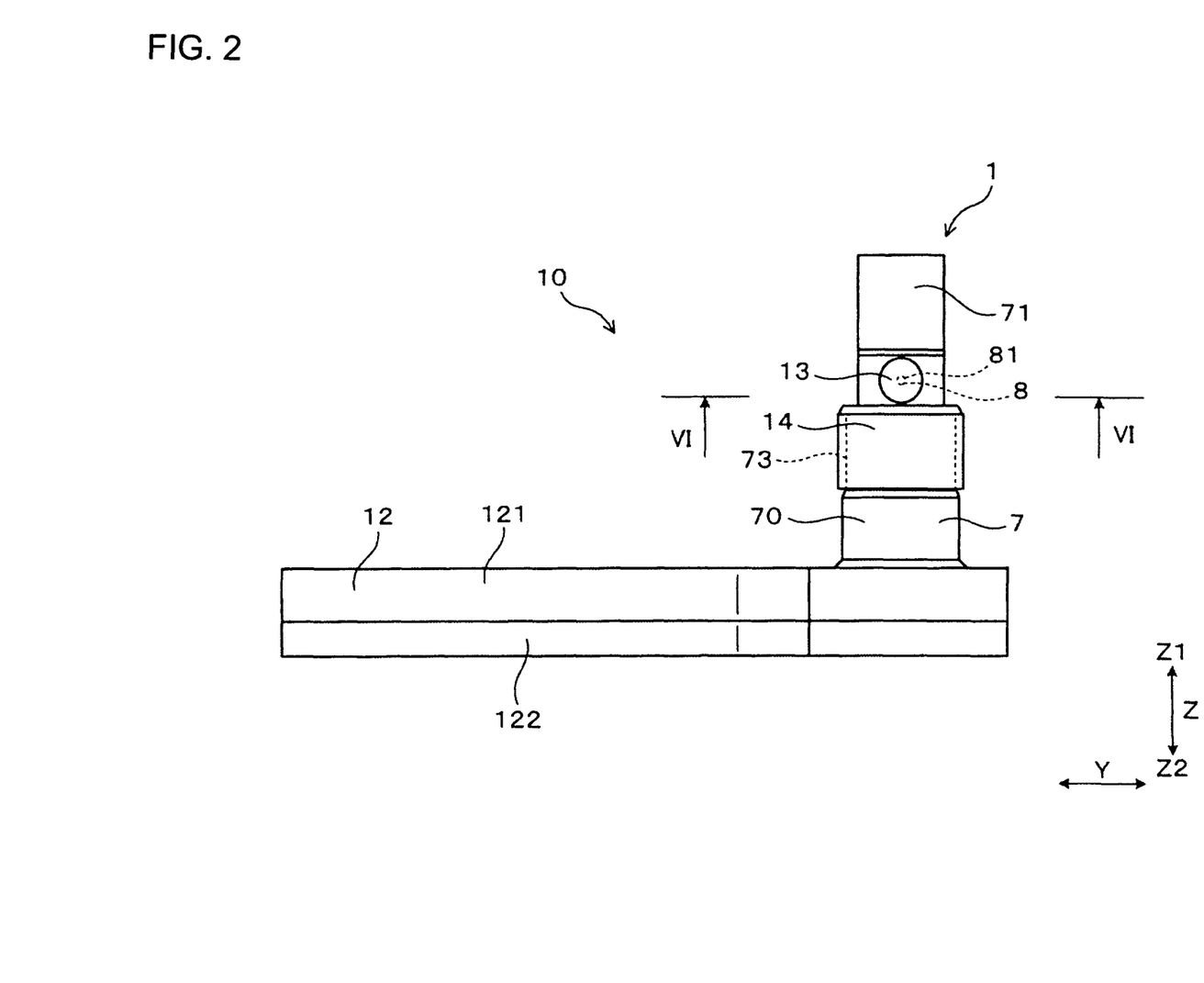
FIG. 2 is a side view of the control device in the first embodiment.
Figure 3:
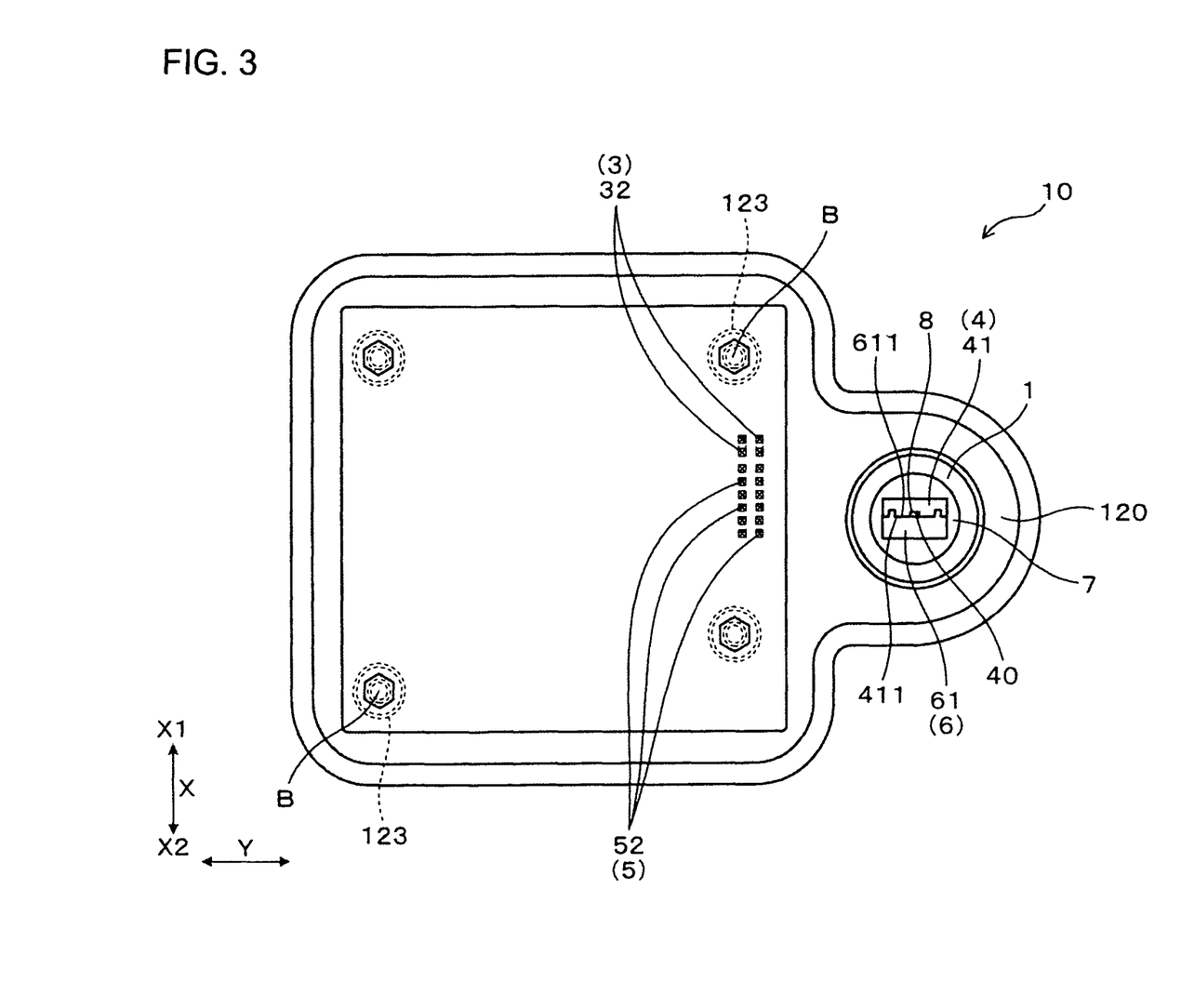
FIG. 3 is a bottom view of the control device with a second case part removed in the first embodiment.

As shown in FIGS. 2, 4 and 5, the case 12 has a first case part 121 and a second part 122 that are divided into two in the Z direction and connected by unillustrated bolts. As shown in FIGS. 3 and 5, the electronic board 11 is fastened to bosses 123 provided in the first case 121 or fixed to the first case 121 by bolts B.

As shown in FIGS. 4 and 5, an arrangement hole 124 penetrates through a wall of the first case 121. The connector 1 is inserted and fit in the arrangement hole 124 and partially projects out from the case 12. Although not shown, watertightness and airtightness are ensured between the connector 1 and the arrangement hole 124.

Figure 1:
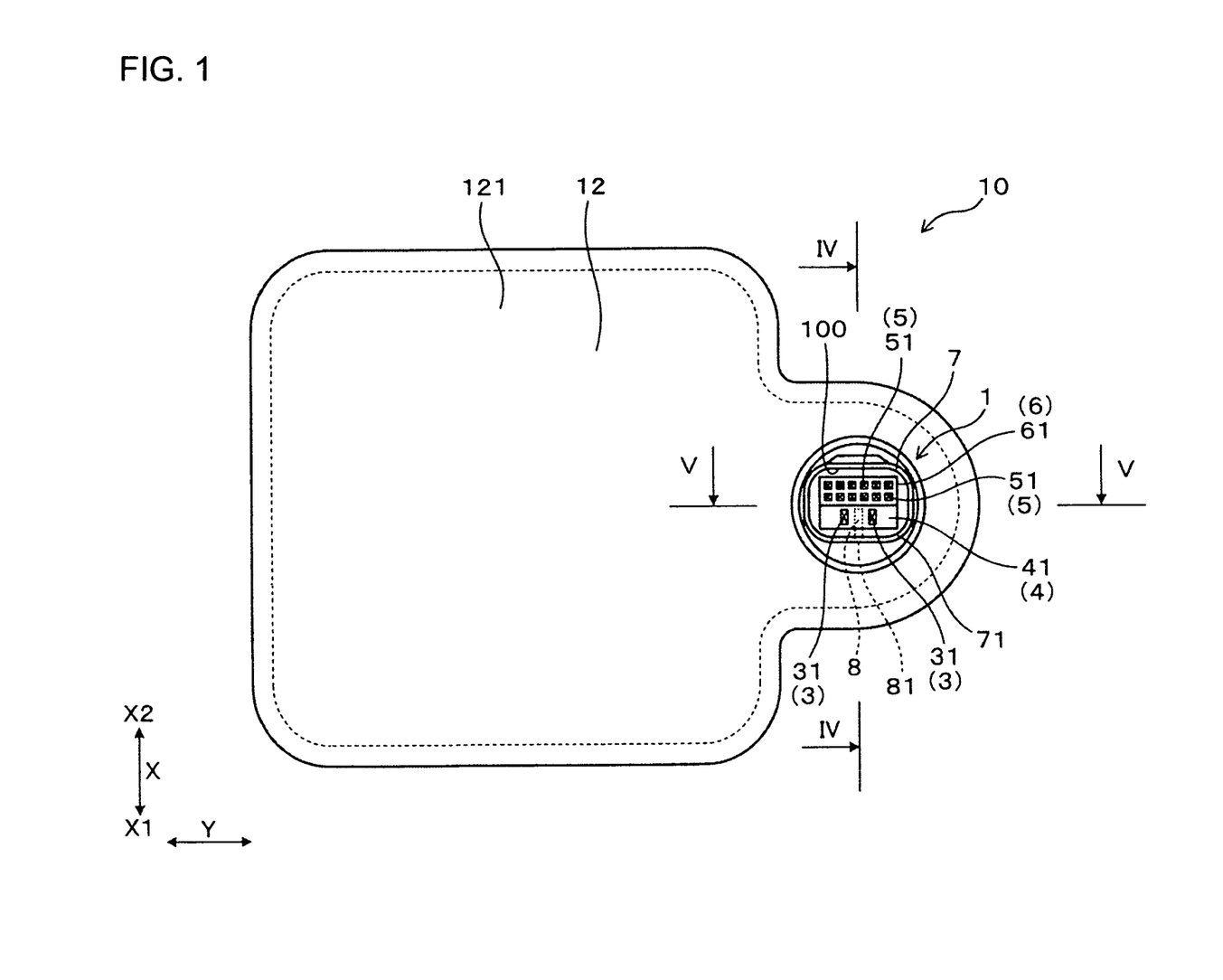
FIG. 1 is a plan view of a control device in a first embodiment.

As shown in FIG. 1, the connector 1 includes the first terminals 3 and the second terminals 5. Each of the first and second terminals 3, 5 is constituted by a conductor pin, and the connector 1 is a so-called male connector. The mating connector 101 to be connected to the connector 1 is a so-called female connector. In this embodiment, the first terminals 3 constitute power supply terminals and the second terminals 5 constitute control terminals, but there is no limitation to this.

One end part of each of the first and second terminals 3, 5 is disposed in the receptacle 71 of the housing 7, as shown in FIG. 1, and the other end part of each of the first and second terminals 3, 5 is disposed in the internal space 120 of the case 12 and is inserted and connected to a through hole of the electronic board 11, as shown in FIG. 3. An end part of the first terminal 3 on a side to be disposed in the receptacle 71 is referred to as a first outer terminal portion 31, and an end part of the second terminal 5 on a side to be disposed in the receptacle 71 is referred to as a second outer terminal portion 51. Further, an end part of the first terminal 3 on a side to be disposed in the case 12 is referred to as a first inner terminal portion 32, and an end part of the second terminal 5 on a side to be disposed in the case 12 is referred to as a second inner terminal portion 52.

Figure 7:
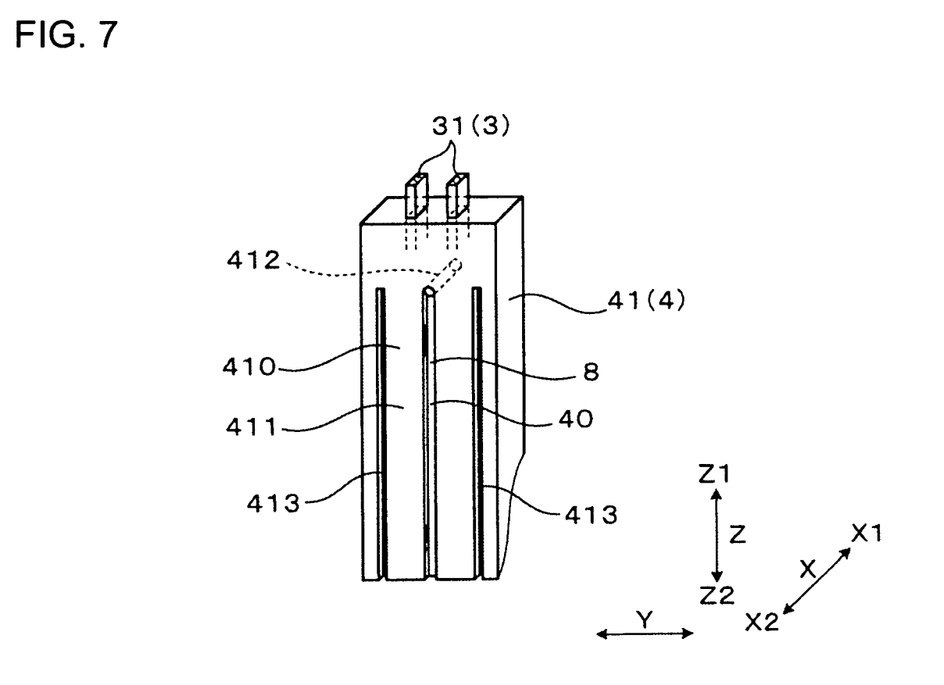
FIG. 7 is a perspective view of a first plate and first terminals viewed from an overlapping surface side of the first plate.

As shown in FIGS. 1, 5 and 6, the connector 1 includes two first terminals 3 that are arranged at a distance from each other. As shown in FIGS. 1, 5 and 7, the first outer terminal portions 31 of the two first terminals 3 are arranged at a distance from each other in the Y direction. As schematically shown in FIG. 5, the first terminals 3 are bent into a crank shape. Although not shown, the second terminals 5 also are bent into a crank shape to extend parallel to the first terminals 3. The two first terminals 3 are held in the first core 4 while both end parts thereof are exposed from the first core 4.

The first core 4 is an insert molded part that is formed by injecting a resin into a mold with the two first terminals 3 arranged at a predetermined interval in the mold.

As shown in FIGS. 4, 6 and 7, the first core 4 includes a rectangular first plate 41 having a thickness in the X direction, a width in the Y direction and a length in the Z direction. The first outer terminal portions 31 project from the first plate 41.

A Z1 end of the first plate 41 is exposed in the receptacle 71 of the housing 7, as shown in FIGS. 1 and 4, and a Z2 end part of the first plate 41 is exposed in the internal space 120 of the case 12, as shown in FIGS. 3 and 4.

As shown in FIGS. 4 and 6, the first plate 41 has a first overlapping surface 411 on an X2 side in the X direction. The first overlapping surface 411 faces the second core 6.

As shown in FIGS. 4 to 7, the first overlapping surface 411 includes the groove 40 constituting the ventilation passage 8. The groove 40 is formed so that a part of the first overlapping surface 411 is recessed toward the X1 side. As shown in FIG. 6, the groove 40 has a rectangular internal space in a cross-section perpendicular to a formation direction thereof, but there is no limitation to this and the internal space may have another shape such as a semicircular shape or a triangular shape.

The groove 40 extends straight in the Z direction and a Z2 end is open to the internal space 120 of the case 12, as shown in FIGS. 3 to 5. As shown in FIGS. 4, 5 and 7, a Z1 end of the groove 40 is formed more on the Z2 side than the Z1 end of the first plate 41. Specifically, the groove 40 is formed from a Z2 end edge of the first plate 41 to a position before a Z1 end edge of the first plate 41 and is not open on the Z1 end.

As shown in FIGS. 4 to 7, the first plate 41 includes a core through hole 412 formed to communicate with the groove 40. The core through hole 412 constitutes a part of the ventilation passage 8. The core through hole 412 is formed on the X1 side from the Z1 end part of the groove 40. The core through hole 412 is formed straight in a thickness direction (X direction) of a part of the first core 4 formed with the core through hole 412 (i.e. first plate 41). The core through hole 412 penetrates through the first plate 41 in the X direction. The core through hole 412 is formed to pass through between the two first terminals 3, but the first terminals 3 are not exposed to the core through hole 412.

As shown in FIGS. 5 and 7, the core through hole 412 has a circular cross-section perpendicular to the X direction. Note that there is no limitation to this and the cross-section of the core through hole 412 perpendicular to the X direction can have another shape such as an elliptical shape or a rectangular shape.

As shown in FIGS. 6 and 7, the first overlapping surface 411 includes elongated recesses 413 formed at positions separated in the Y direction from the groove 40. As shown in FIG. 7, each elongated recess 413 is parallel to the groove 40. The elongated recesses 413 are grooves that receive later-described ridges 612 formed on the second core 6. The elongated recesses 413 are formed at both sides of the groove 40 in the Y direction. These two elongated recesses 413 are formed outwardly of the two first terminals 3 embedded in the first plate 41 in the Y direction.

As shown in FIG. 7, each elongated recess 413 is formed in an area in the Z direction where the groove 40 is formed and is open on the Z2 end. Specifically, each elongated recess 413 is formed up to the Z2 end edge of the first plate

41. As shown in FIG. 6, the elongated recesses 413 are formed deeper than the groove 40. Further, as shown in FIG. 6, a total length of three sides constituting the elongated recess 413 is preferably longer than. a total length of three sides constituting the groove 40 in a cross-section of the connector 1 perpendicular to the Z direction. In this way, a contact area of the ridge 612 and the elongated recess 413 is increased.

Figure 8:
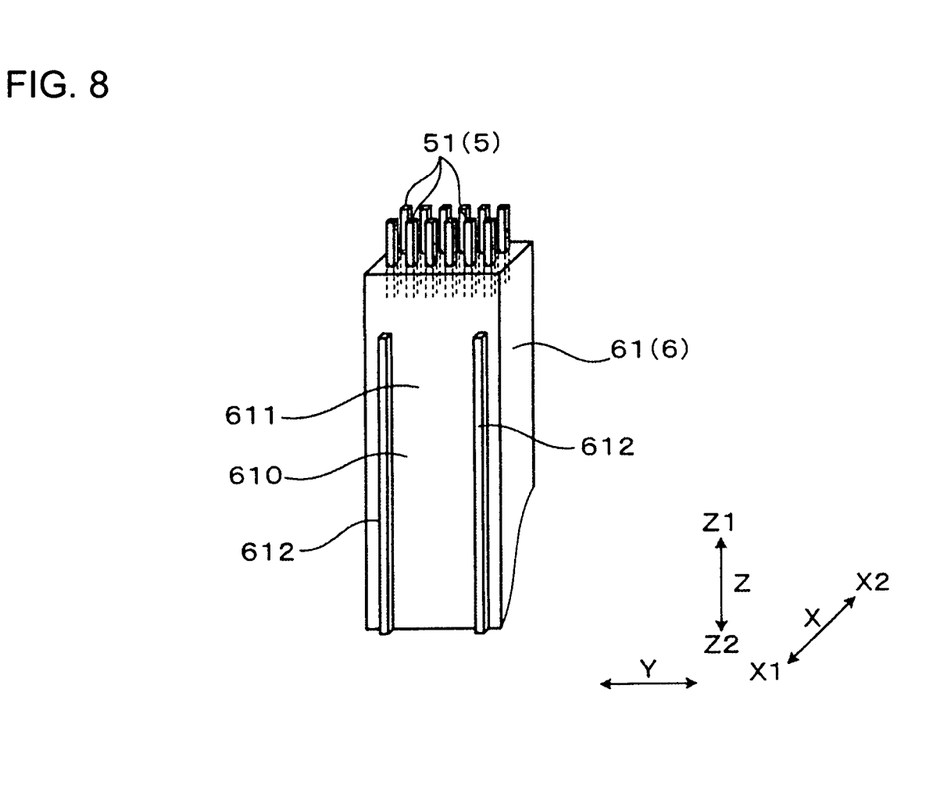
FIG. 8 is a perspective view of a second plate and second terminals viewed from an overlapping surface side of the second plate.

As shown in FIGS. 4 and 6, the second core 6 faces the first overlapping surface 411. As shown in FIGS. 6 and 8, twelve second terminals 5 are embedded in the second core 6 at predetermined intervals. The second outer terminal portions 51 of the twelve second terminals 5 are arranged such that six second outer terminal portions 51 arranged in the Y direction are in each of two rows in the X direction. The twelve second terminals 5 are held in the second core 6 while exposing at least both end parts thereof.

The second core 6 is an insert molded part formed by injecting a resin into a mold with the twelve second terminals 5 arranged at predetermined intervals in the mold. Note that six second terminals 5 arranged in the Y direction on the X1 side and six second terminals 5 arranged in the Y direction on the X2 side may be held by separate cores, and these cores may be overlapped. In this case, the core for holding the six second terminals 5 arranged in a row on the X1 side, i.e. the core constituting the ventilation passage 8 by closing the groove 40 of the first core 4, serves as the second core 6. By holding the terminals separated in two rows by the different cores in this way, the terminals easily are arranged and fixed in the mold when the cores are molded.

As shown in FIGS. 4, 6 and 8, the second core 6 includes the second plate 61 having a thickness in the X direction. The second outer terminal portions 51 project from the second plate 61. As shown in FIGS. 4 and 8, the second plate 61 is a rectangular plate long in the Z direction and short in the Y direction. As shown in FIG. 4, a length of the second plate 61 in the Z direction is equal to that of the first plate 41 in the Z direction.

A Z1 end of the second plate 61 is exposed in the receptacle 71 of the housing 7, as shown in FIGS. 1 and 4, and a Z2 end of the second plate 61 is exposed in the internal space 120 of the case 12, as shown in FIGS. 3 and 4.

As shown in FIGS. 4 and 6, a surface of the second plate 61 on the X1 side constitutes a second overlapping surface 611 to be overlapped with the first overlapping surface 411 of the first core 4.

As shown in FIGS. 4 and 6, the second overlapping surface 611 of the second core 6 closes the entire groove 40 in the first overlapping surface 411 from the X2 side. The second overlapping surface 611 has no groove portion 40 as formed in the first core 4, and the second overlapping surface 611 closes the groove 40 in the first overlapping surface 411 by a principal surface 610 thereof from the X2 side. At least a part of the ventilation passage 8 is constituted by an area surrounded by the groove 40 of the first plate 41 and the second overlapping surface 611. Note that, a principal surface of a specific surface means one surface if the specific surface is the one surface, and means a surface having a largest area, out plural surfaces, if the specific surface is composed of plural surfaces.

The principal surface 610 of the second overlapping surface 611 is flat and perpendicular to the X direction, as shown in FIG. 8, and overlaps a principal surface 410 of the first overlapping surface 411 of the first plate 41, as shown in FIGS. 4 and 6. The principal surface 410 of the first overlapping surface 411 also is flat and perpendicular to the X direction. The principal surface 610 of the second overlapping surface 611 overlaps substantially the entire principal surface 410 of the first overlapping surface 411.

As shown in FIGS. 6 and 8, the second overlapping surface 611 includes the ridges 612 formed along both sides of the groove 40 in the Y direction. In the Y direction, at least parts of the ridges 612 are formed between two adjacent second terminals 5. The ridges 612 are at positions inward of both ends of the second plate 61 in the Y direction.

As shown in FIG. 6, two ridges 612 are inserted into the two elongated recesses 413 in the first plate 41. In a cross-section perpendicular to the Z direction, the ridges 612 have substantially the same shape as the elongated recesses 413 to which the ridges 612 are fit. Specifically, the ridges 612 just fit in the elongated recesses 413. Note that, without being limited to this, the ridges 612 may be slightly larger than the elongated recesses 413 in the cross-section perpendicular to the Z direction and may be press-fit into the elongated recesses 413 or the ridges 612 can be made slightly smaller than the elongated recesses 413.

The first core 4 and the second core 6 may include parts extending in the X direction and the Z direction from the Z2 ends of the first plate 41 and the second plate 61. Specifically, the first and second cores 4, 6 may have bent shapes instead of being straight plates. Only the first plate 41 of the first core 4 is shown in FIGS. 5 and 7 and only the second plate 61 of the second core 6 is shown in FIG. 8. Further, the first terminals 3 may be held by the first core 4 divided into a plurality of parts. Similarly, the second terminals 5 may be held in the second core 6 divided into a plurality of parts.

As shown in FIGS. 4 to 6, the first and second cores 4, 6 are held in the housing 7. The housing 7 is insert molded by injecting a resin into a mold with the first core 4 holding the first terminals 3 and the second core 6 holding the second terminals 5 arranged in an overlapping manner in the mold. Specifically, in producing the connector 1, the first and second cores 4, 6 are molded primarily and, thereafter, the housing 7 is molded secondarily.

As shown in FIGS. 2, 4 and 5, a housing projection 70 projects in the Z1 direction from a part of the housing 7 and protrudes through the first case part 121 of the case 12. The housing projection 70 is long in the Z direction, and the receptacle 71 is formed on a Z1 side of the housing projection 70.

As shown in FIGS. 1, 4 and 5, the receptacle 71 surrounds the first outer terminal portions 31 of the first terminals 3 and the second outer terminal portions 51 of the second terminals 5 and has a tubular shape. A Z2 side of the receptacle 71 is closed by a part of the housing 7, the Z1-side of the first plate 41 and the Z1-side of the second plate-61. The first outer terminal portions 31 projecting from the first plate 41 and the second outer terminal portions 51 projecting from the second plate 61 are disposed in the receptacle 71.

As shown in FIG. 4, a housing through hole 72 is formed at a position adjacent to the Z2 side of the receptacle 71 in an outer peripheral part of the housing 7. As shown in FIGS. 4 and 6, the housing through hole 72 penetrates through a wall of the outer peripheral part of the housing 7 in the X direction and communicates with the core through hole 412. The housing through hole 72 is continuous with the core through hole 412 on one straight line.

As shown in FIG. 4, the ventilation passage 8 has a part formed by the first and second cores 4, 6 and a part formed by the housing 7. Specifically, the ventilation passage 8 is formed by the groove 40, the principal surface 610 of the second overlapping surface 611, the core through hole 412 and the housing through hole 72. Specifically, the internal space 120 of the case 12 communicates with a space outside the case 12 via an area surrounded by the groove 40 and the principal surface 610 of the second overlapping surface 611, the inside of the core through hole 412 and the inside of the housing through hole 72. An end part of the housing through hole 72 on a side (X1 side) opposite to the core through hole 412 constitutes an outer vent 81. The outer vent 81 is not open to the inside of the receptacle 71 in the connector 1 and is formed in an outer peripheral part of the connector 1.

As shown in FIGS. 2, 4 and 6, a ventilation film 13 is attached to the outer peripheral part of the housing 7 to cover the outer vent 81. The ventilation film 13 is a filter for allowing the passage of gas while suppressing the passage of liquid and solid. The ventilation film 13 can be a porous film, for example, made of fluororesin or polyolefin. The ventilation film 13 has a circular shape, but is not limited to this.

As shown in FIGS. 2, 4 and 5, an outer peripheral part of the housing projection 70 includes a seal arrangement recess 73 on a Z2 side of the outer vent 81. The seal arrangement hole 73 is recessed toward an inner peripheral side over the entire periphery. An annular seal 14 is fit into the seal arrangement hole 73. As shown in FIG. 4, the seal 14 seals between the connector 1 and a mating case 102 in which the mating connector 101 is mounted. Specifically, the housing projection 70 is inserted into a mating arrangement hole 103 formed in the mating case 102, and the seal 14 seals between the connector 1 and the mating arrangement hole 103 of the mating case 102.

As shown in FIGS. 4 and 5, a part of the connector 1 on the Z2 side of the housing projection 70 is inserted into the case 12 through the arrangement hole 124 of the first case part 121.

The control device 10 provided with the connector 1 is in an oil filled automatic transmission. As shown in FIG. 4, with the mating connector 101 and the mating case 102 assembled with the connector 1, an area of the control device 10 more on the Z2 side than the seal 14 is disposed in oil, whereas an area thereof more on the Z1 side than the seal portion 14 is in an internal space 104 of the mating case 102. Accordingly, the outer vent 81 between the receptacle 71 and the seal 14 in the Z direction is in the internal space 104 of the mating case 102. The internal space 104 of the mating case 102 communicates with an atmosphere. In this way, when the control device 10 provided with the connector 1 is mounted in a vehicle, the ventilation passage 8 communicates with the atmosphere via the mating case 102 from the outer vent 81.

Next, functions and effects of this embodiment are described.

In the connector 1 of this embodiment, the outer vent 81 in the ventilation passage 8 is formed at a position more on the Z2 side than the receptacle 71 in the Z direction. Thus, the outer vent 81 of the ventilation passage 8 is not closed even with the mating connector 101 mounted to the connector 1. Therefore, the connector 1 easily allows a pressure in the case 12 to escape even with the mating connector 101 connected to the connector 1.

Further, at least a part of the ventilation passage 8 is formed by the inside of the groove 40 in the first overlapping surface 411 of the first core 4. In this way, the ventilation passage 8 can be easily formed in the connector 1. This is described later.

On the other hand, in the case of forming a ventilation passage only in a housing, it is considered to arrange a long pin for forming the ventilation passage in a mold for molding the housing and to form the ventilation passage in the housing by removing the pin after molding the housing. However, the pin may break during molding and the broken pin cannot form the ventilation passage. Further, in the case of forming a ventilation passage having a bent shape, such as an L shape, in a housing, it is necessary to arrange plural pins in a mold and the formation of the ventilation passage is difficult.

On the other hand, the ventilation passage 8 is formed partly by the inside of the groove 40 in the first overlapping surface 411 of the first core 4 in this embodiment, the ventilation passage 8 is formed easily without using a long pin as described above.

Further, the ventilation passage 8 is formed at least partially by the area surrounded by the groove 40 in the first overlapping surface 411 of the first core 4 and the principal surface 610 of the second overlapping surface 611 of the second core 6. Thus, the ventilation passage 8 can be formed without forming the second core 6 into a special shape, and overall productivity of the connector 1 is good.

The first core 4 includes the core through hole 412 that communicates with the groove 40 and the core through hole 412 constitutes a part of the ventilation passage 8. The core through hole 412 of the ventilation passage 8 can be formed without using a long pin by forming the core through hole 412 in the first core 4 covered by the housing 7 and having a relatively small size. Thus, the internal space of the groove 40, i.e. the ventilation passage 8 can easily communicate with the outside of the connector 1.

Further, the core through hole 412 is formed in the thickness direction of the first plate 41 of the first core 4. Thus, the core through hole 412 easily is made shorter.

The ventilation passage 8 is constituted by the part formed by the first and second cores 4 and 6 and the part formed by the housing 7. Thus, the ventilation passage 8 is formed easily in the housing 7. For example, a pin or the like for forming the housing through hole 72 of the housing 7 is inserted into the core through hole 412 of the first core 4. Subsequently, the housing 7 is insert-molded with the first core 4 having the pin inserted therein and the second core 6. Thus, the housing through hole 72 constituting the ventilation passage 8 is formed around the pin. In this way, a length of the pin is made shorter as compared to the case where the ventilation passage 8 is formed only by the housing 7. Therefore, pin breakage is unlikely and a proper ventilation passage 8 is assured.

The outer vent 81 is covered by the ventilation film 13 that allows the passage of gas while suppressing the passage of liquid and solid. Thus, liquid or solid external matter cannot intrude into the case 12 via the ventilation passage 8 from the outer vent 81.

The second core 6 includes the ridges 612 formed along the groove 40 at both sides of the formation position of the groove 40 and to be fit to the first core 4. Thus, a sufficient contact area of the first and second cores 4, 6 can be ensured on connection surfaces of the ridges 612 and the first core 4. In pouring liquid resin, which will constitute the housing 7, into the mold for molding the housing 7 with the first and second cores 4, 6 arranged in the mold during the molding of the housing 7, it is easily prevented that the liquid resin flows along an interface between the first and second cores 4, 6 to close the ventilation passage 8. Further, the ridges 612 are formed at positions separated from the groove 40 in this embodiment, and the liquid resin that is used to form the housing 7 will not enter the interface between the first and second cores 4, 6 at the positions separated from the groove 40 and the intrusion of the resin into the groove 40 is prevented.

Further, the first core 4 includes the elongated recesses 413 to be fit to the ridges 612, and the elongated recesses 413 are deeper than the groove 40. Thus, sufficient contact areas of the ridges 612 and the elongated recesses 413 are ensured to prevent the ventilation passage 8 from being closed by the resin of the housing 7.

The outer vent 81 is formed between the receptacle 71 and the seal 14 in the Z direction. Thus, even if the control device 10 provided with the connector 1 is disposed in oil, the outer vent 81 communicates with outside air via the inside of the mating case 102.

As described above, according to this embodiment, a connector allowing a pressure in a case to escape can be provided even in a state connected to a mating connector.

Figure 9:
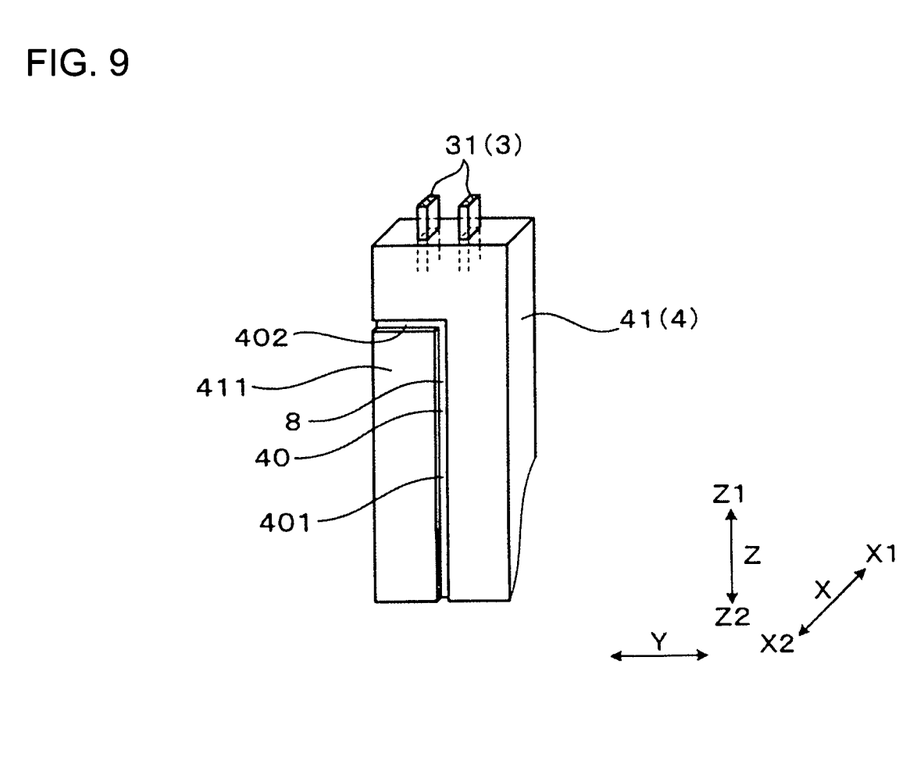
FIG. 9 is a perspective view of a first plate and first terminals in a second embodiment viewed from an overlapping surface side of the first plate.
Figure 10:
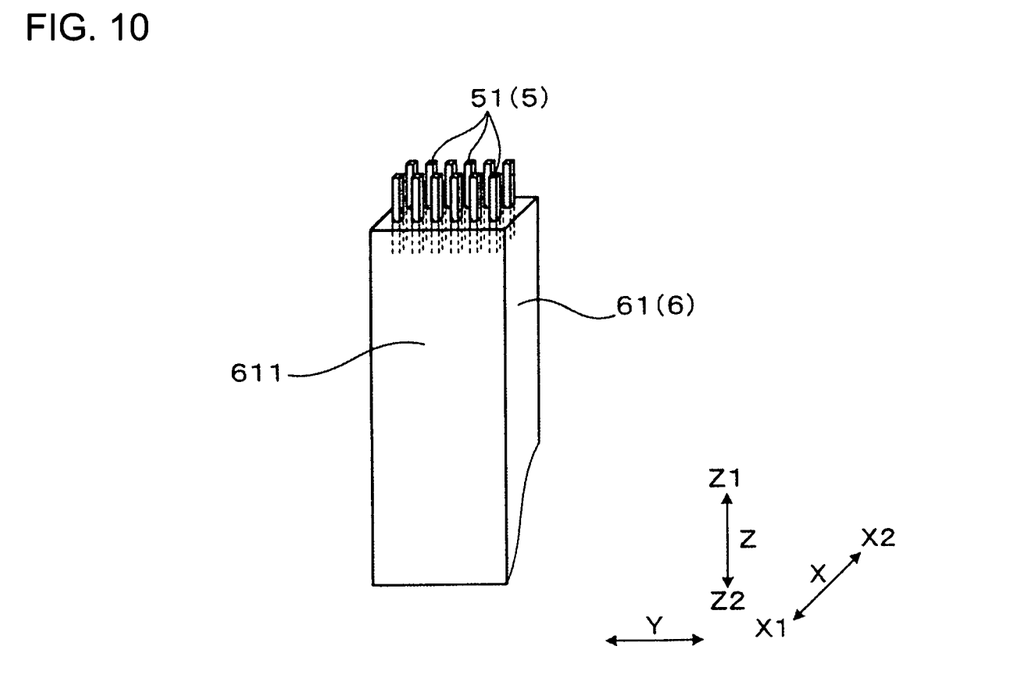
FIG. 10 is a perspective view of a second plate and second terminals in the second embodiment viewed from an overlapping surface side of the second plate.
Figure 11:
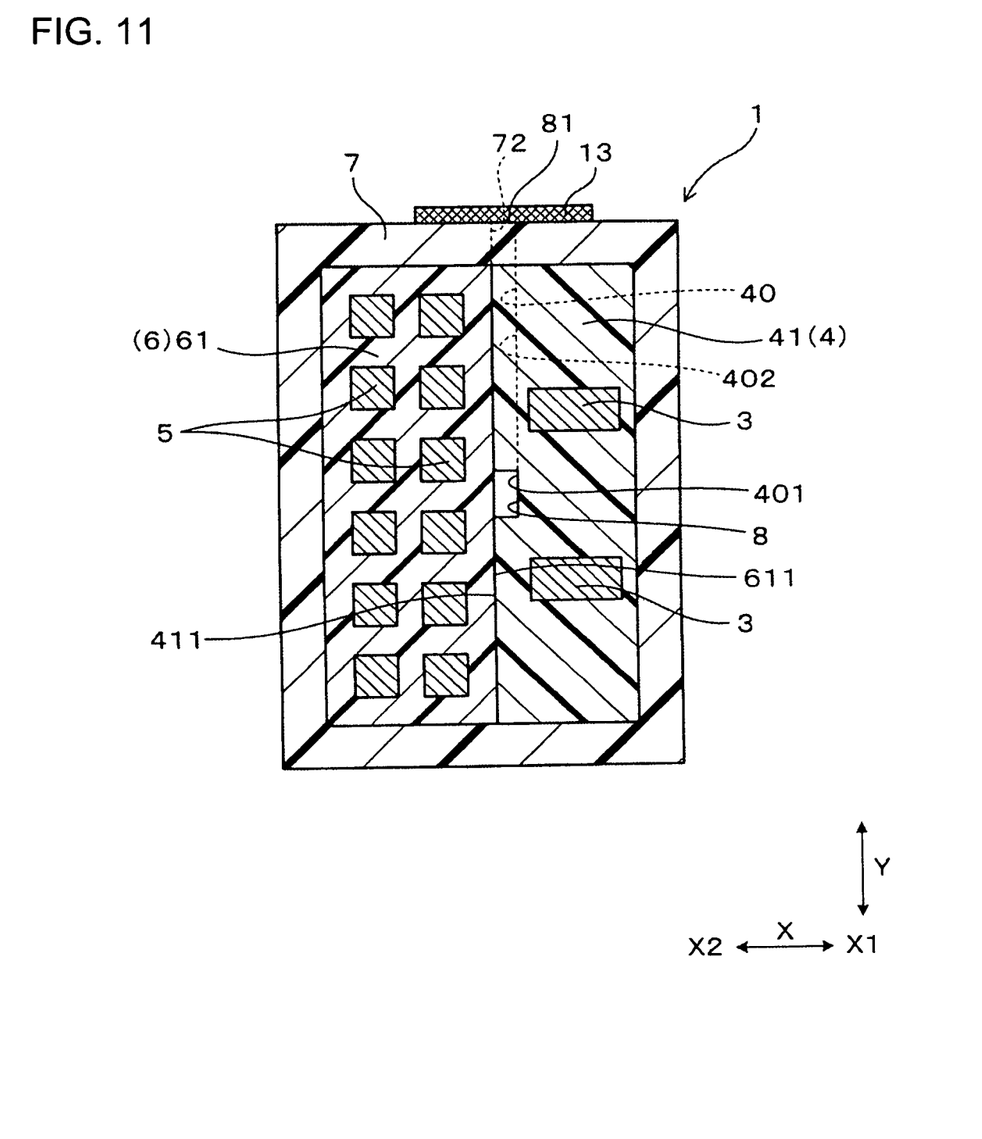
FIG. 11 is a section, corresponding to the section of FIG. 6, in the second embodiment.

A second embodiment differs from the first embodiment in how to form a ventilation passage 8, as shown in FIGS. 9 to 11.

As shown in FIGS. 9 and 11, a first plate 41 of a first core 4 includes a groove 40 but is not formed with a core through hole (see reference sign 412 in FIGS. 4 to 7). As shown in FIG. 9, the groove 40 includes a first groove portion 401 extending in the Z direction and a second groove portion 402 extending toward one side in the Y direction from a Z1 end part of the first groove portion 401 to define an L-shape. A Z2 end part of the first groove portion 401 is open on a Z2 side. Further, an end part of the second groove portion 402 opposite to the first groove portion 401 is open in the Y direction.

As shown in FIG. 11, the groove 40 formed in an overlapping surface 411 of the first plate 41 is covered by a second overlapping surface 611 of a second plate 61 and forms at least a part of a ventilation passage 8. As shown in FIG. 10, the second overlapping surface 611 of the second plate 61 is flat and perpendicular to the X direction. Similar to the first embodiment, the first overlapping surface 411 of the first plate 41 and the second overlapping surface 611 of the second plate 61 may be formed with ridges (see reference sign 612 of FIGS. 6 and 8) and elongated recesses (see reference sign 413 of FIGS. 6 and 7). In this case, the ridges and the elongated recesses can be L-shaped to extend along the groove 40.

As shown in FIG. 11, a housing 7 includes a housing through hole 72 communicating with the second groove portion 402 and formed to penetrate through the housing 7 in the Y direction on an opening side of the second groove portion 402. The housing through hole 72 is continuous with the second groove portion 402 on one straight line. In this embodiment, the ventilation passage 8 is constituted by the groove 40 and the housing through hole 72. That is, the first and second cores 4, 6 are not formed with holes for forming the ventilation passage 8. An end part of the housing through hole 72 opposite to the second groove portion 402 constitutes an outer vent 81. A ventilation film 13 is disposed on the housing 7 to close the outer vent 81.

The other points are the same as in the first embodiment.

Note that reference signs used in the second and subsequent embodiments are the same as those used in the previous embodiment(s) unless otherwise specified.

In this embodiment, since the ventilation passage 8 constituted by the first and second cores 4, 6 is formed by covering the groove 40 in the first core 4 by the second overlapping surface 611 of the second core 6, the ventilation passage 8 is formed easily. Other functions and effects are the same as the first embodiment.

Figure 12:
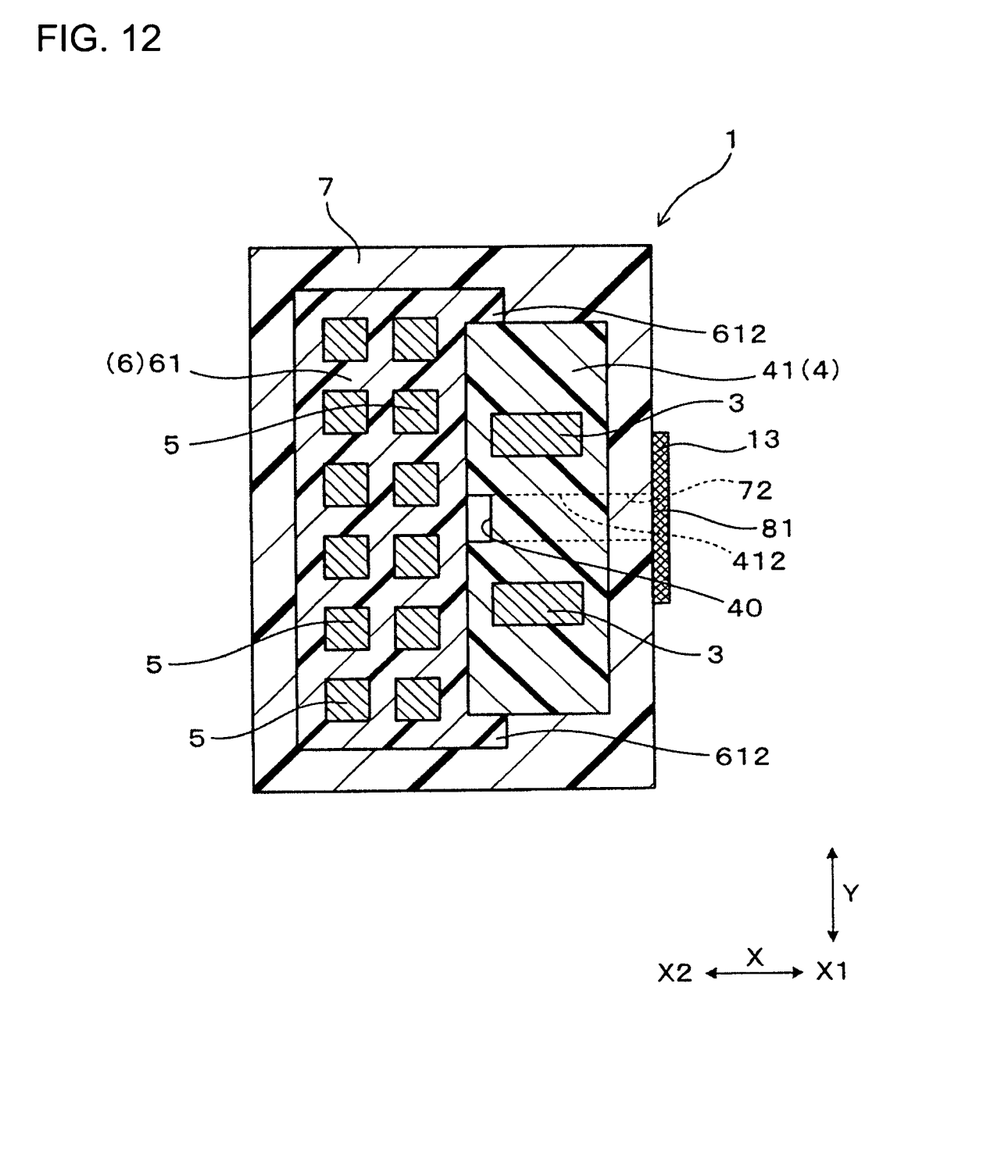
FIG. 12 is a section, corresponding to the section of FIG. 6, in a third embodiment.

A third embodiment differs from the first embodiment in the shape of ridges 612 of a second core 6 and the elimination of elongated recesses (see reference sign 413 of FIGS. 6, 7 and the like) of a first core 4 as shown in FIG. 12.

In this embodiment, a second plate 61 of the second core 6 includes the ridges 612 projecting toward an X1 side from both end parts in the Y direction. A first plate 41 of the first core 4 has a dimension in the Y direction equal to a dimension between two of the ridges 612, and is fit to the second plate 61 of the second core 6 to be disposed inwardly of the ridges 612 of the second plate 61. A surface of the first plate 41 on an X2 side is constituted by a flat surface perpendicular to the X direction except at a groove 40.

The other points are the same as in the first embodiment.

The ridges 612 of the second core 6 are fit to the first core 4 also in this embodiment. Thus, a contact area between the first core 4 and the second core 6 can be larger. Liquid resin can be poured into a mold for molding the housing 7 with the first and second cores 4, 6 disposed in the mold, and there is no risk that the liquid resin flows along an interface between the first and second cores 4, 6 to close a ventilation passage 8.

Further, the first core 4 fits between the ridges 612 of the second core 6. Thus, the contact area between the first core 4 and the second core 6 is ensured while the shape of the first core 4 is simplified.

Other functions and effects are the same as the first embodiment.

The invention is not limited to these respective embodiments and can be applied to other embodiments without departing from the scope of the invention defined by the claims.

For example, although the connector 1 is mounted on the case 12 in each of the above embodiments, there is no limitation to this and the connector 1 may be a part of the case 12. That is, the connector 1 may be formed integrally to the first case part 121.

The Z2 end parts of the ridges 612 are formed up to the Z2 end edge of the first plate 41 in each of the above embodiments. However, the Z2 end parts may not be formed up to the Z2 end edge of the first plate-like portion 41. For example, the Z2-side end parts of the ridges 612 can be formed up to a position (on the Z1 side) before the Z2 end edge of the first plate 41. Further, a similar change can be made also for the elongated recesses 413.

The ventilation passage 8 is formed partially by the groove 40 in the first core 4 and the principal surface 610 of the second overlapping surface 611 of the second core 6 in each of the above embodiments. However, a groove open on the X1 side also may be formed in the principal surface 610 of the second overlapping surface 611 of the second core 6 and the ventilation passage 8 can be formed partially by overlapping the groove 40 of the first plate 41 and the groove of the second plate 61.

LIST OF REFERENCE SIGNS 1 connector
101 mating connector
11 electronic board
12 case
120 internal space
13 ventilation film
14 seal
3 first terminal
4 first core
40 groove
411 first overlapping surface
412 core through hole 413 elongated recess
5 second terminal
6 second core
611 second overlapping surface
612 ridge
7 housing
71 receptacle
8 ventilation passage
81 outer vent

What is claimed is:

1. A connector to be provided or mounted on a case having an internal space accommodating an electronic board, comprising:
   first terminals;
   a first core configured to hold the first terminals while exposing both ends of the first terminals;
   second terminals;
   a second core, the second core, the second core holding the second terminals while exposing both ends of the second terminals;
   a housing including a tubular receptacle surrounding one end part of each of the first terminals and the second terminals and having a mating connector inserted therein, the housing at least partially covering the first core and the second core; and
   a ventilation passage configured to allow the internal space to communicate with outside air;
   wherein:
   at least an inner part of the ventilation passage is formed by a groove in at least one of overlapping surfaces of the first core and the second core, the groove having an internal end that opens into the internal space and defines an internal end of the ventilation passage; and
   an outer vent of the ventilation passage further has an outer part that communicates with the groove and that opens at a position spaced from the case and spaced from the receptacle in a mounting direction of the connector to the mating connector.

2. The connector of claim 1, wherein at least a part of the ventilation passage is constituted by an area surrounded by the groove formed in at least one of the overlapping surfaces of the first core and the second core.

3. The connector of claim 1, wherein the first core or the second core includes a core through hole formed to communicate with the groove, and the core through hole constitutes a part of the ventilation passage.

4. The connector of claim 1, wherein the ventilation passage is constituted by a part formed by the first core and the second core and a part formed by the housing.

5. The connector of claim 1, wherein the outer vent is covered by a ventilation film configured to allow a passage of gas while suppressing passage of liquid and solid.

6. The connector of claim 1, wherein one of the first core and the second core includes ridges formed along the groove at both sides of a formation position of the groove.

7. The connector of claim 1, wherein an outer peripheral part of the housing is provided with a seal disposed on a side closer to the case than the receptacle, and the outer vent is formed between the receptacle and the seal in a mounting direction.

8. A connector to be provided or mounted on a case having an internal space accommodating an electronic board, comprising:
   first terminals;
   a first core configured to hold the first terminals while exposing both ends of the first terminals;
   second terminals;
   a second core facing and overlapping with the first core, the second core holding the second terminals while exposing both ends of the second terminals;
   a housing including a tubular receptacle surrounding one end part of each of the first terminals and the second terminals and having a mating connector inserted therein, the housing at least partially covering the first core and the second core; and
   a ventilation passage configured to allow the internal space to communicate with outside air, wherein:
   at least a part of the ventilation passage is formed by a groove in at least one of overlapping surfaces of the first core and the second core;
   an outer vent of the ventilation passage is at a position closer to the case than the receptacle in a mounting direction of the connector to the mating connector;
   one of the first core and the second core includes ridges formed along the groove at both sides of a formation position of the groove; and
   one of the first core and the second core includes elongated recesses to be fit to the ridges, and the elongated recesses are deeper than the groove.

9. A connector to be provided or mounted on a case having an internal space accommodating an electronic board, comprising:
   first terminals;
   a first core holding the first terminals while exposing both ends of the first terminals, the first core having first and second intersecting surfaces;
   second terminals;
   a second core holding the second terminals while exposing both ends of the second terminals, the second core having first and second intersecting surfaces that overlap respectively with the first and second intersecting surfaces of the first core;
   a housing including a tubular receptacle surrounding one end part of each of the first terminals and the second terminals and having a mating connector inserted therein, the housing at least partially covering the first core and the second core; and
   a ventilation passage configured to allow the internal space of the case to communicate with outside air,
   a first part of the ventilation passage being formed by a first groove formed in at least one of the first surface of the first core and the first surface of the second core, the first part of the ventilation passage is open into the internal space of the case, and
   a second part of the ventilation passage being formed by a second groove formed in at least one of the second surface of the first core and the second surface of the second core, the second part of the ventilation passage has an internal end that opens into the first part of the ventilation passage and an external end that opens at a position in the housing spaced from both the case and the receptacle.

10. The connector of claim 9, wherein the first and second intersecting surfaces of the first core intersect at substantially right angles and the first and second intersecting surfaces of the second core intersect at substantially right angles.

11. The connector of claim 9, wherein the ventilation passage includes further includes a housing through hole externing through the housing a communicating with the external end of the second part of the ventilation passage.

* * * * *